(12) United States Patent
Grejda et al.

(10) Patent No.: US 9,254,538 B2
(45) Date of Patent: Feb. 9, 2016

(54) METHOD OF MINIMIZING STACKING ELEMENT DISTORTIONS IN OPTICAL ASSEMBLIES

(71) Applicant: CORNING INCORPORATED, Corning, NY (US)

(72) Inventors: Robert Dennis Grejda, Fairport, NY (US); Todd Robert McMichael, Rochester, NY (US)

(73) Assignee: Corning Incorporated, Corning, NY (US)

( * ) Notice: Subject to any disclaimer, the term of this patent is extended or adjusted under 35 U.S.C. 154(b) by 198 days.

(21) Appl. No.: 13/959,804

(22) Filed: Aug. 6, 2013

(65) Prior Publication Data

US 2014/0304963 A1    Oct. 16, 2014

Related U.S. Application Data

(60) Provisional application No. 61/812,364, filed on Apr. 16, 2013.

(51) Int. Cl.
*B23P 11/00* (2006.01)
*G02B 7/02* (2006.01)
(Continued)

(52) U.S. Cl.
CPC ............. *B23P 19/04* (2013.01); *G02B 27/0012* (2013.01); *G02B 27/62* (2013.01); *G03F 7/70825* (2013.01); *G03F 7/70975* (2013.01);
(Continued)

(58) Field of Classification Search
CPC .......... B23P 11/00; B23P 15/00; B23P 19/04; G02B 7/00; G02B 7/003; G02B 7/004; G02B 7/005; G02B 7/02; G02B 7/023; G02B 27/0012; G02B 27/0025; G02B 27/62; G02B 7/021; G02B 7/026; G03F 7/70975; G03F 7/70825; Y10T 29/49764; Y10T 29/49769; Y10T 29/49771; Y10T 29/49778; Y10T 29/4978; Y10T 29/49904; G01N 21/8806; G01N 21/956
See application file for complete search history.

(56) References Cited

U.S. PATENT DOCUMENTS 5,428,482 A    6/1995    Bruning et al.
6,563,652 B2 *    5/2003    Sudoh ........................... 359/704
(Continued)

FOREIGN PATENT DOCUMENTS

| DE | 10259599 | | 7/2004 | |
|---|---|---|---|---|
| DE | 102006006401 | A1 * | 8/2007 | ............ G01B 21/20 |
| EP | 1850161 | | 10/2007 | |
| JP | 2000-66075 | | 3/2000 | |
| WO | 2010074743 | | 7/2010 | |

OTHER PUBLICATIONS

Patent Abstract of JP2000-66075.
(Continued)

*Primary Examiner* — David Bryant
*Assistant Examiner* — Matthew P Travers
(74) *Attorney, Agent, or Firm* — Svetlana Z. Short; Timothy M. Schaeberle; Thomas Ryan

(57) ABSTRACT

A compound optical assembly is constructed from a plurality of stacking elements for spacing, aligning, and retaining optical elements within the assembly. Stacking faces of the stacking elements are measured and low-order surface errors are extracted, represented by mathematical approximations having a primary angular frequency. The stacking elements including the optic holders are relatively oriented to promote complementarity between the low-order surface errors of mating stacking faces.

20 Claims, 7 Drawing Sheets

(51) Int. Cl.
  *G02B 27/62* (2006.01)
  *B23P 19/04* (2006.01)
  *G02B 27/00* (2006.01)
  *G03F 7/20* (2006.01)
  *G02B 7/00* (2006.01)

(52) U.S. Cl.
  CPC ............... *B23P 11/00* (2013.01); *G02B 7/003* (2013.01); *G02B 7/026* (2013.01); *Y10T 29/4978* (2015.01); *Y10T 29/49769* (2015.01); *Y10T 29/49771* (2015.01)

(56) References Cited

U.S. PATENT DOCUMENTS 7,471,469 B2    12/2008  Sorg et al.
2008/0068599 A1*  3/2008  Geh et al. ................... 356/239.2

OTHER PUBLICATIONS

PCT/US2014/033964 Search Report.
Yoder et al; Mounting Optics in Optical Instruments, (Book) pp. 106-121.

* cited by examiner

METHOD OF MINIMIZING STACKING ELEMENT DISTORTIONS IN OPTICAL ASSEMBLIES

This application claims the benefit of priority under 35 U.S.C. §119 of U.S. Provisional Application Ser. No. 61/812,364 filed on Apr. 16, 2013 the content of which is relied upon and incorporated herein by reference in its entirety.

TECHNICAL FIELD

The invention relates to optical assemblies and particularly to the assembly of stacking elements that are secured together for spacing, aligning, and retaining optical elements.

BACKGROUND OF THE INVENTION

Many optical assemblies, particularly those used for such purposes as lithographic projection or semi-conductor inspection, have strict requirements for optical performance such as high transmission, low pupil non-uniformity, low RMS wavefront errors, and low transmitted wavefront asymmetries. Design and tolerance considerations play important roles in meeting wavefront performance requirements. For example, design forms are chosen to reduce sensitivity to expected types of errors accompanying the manufacture of optical components, and tolerances of the optical components are chosen with respect to the design sensitivities so that manufacturing variations do not severely influence the system level performance. Nevertheless, the assembly or "build" of even properly designed and manufactured components can introduce additional wavefront errors that degrade overall performance For example, assembly techniques such as bolting, threading, or otherwise fastening the optical components together can produce mechanical stresses or strains on the optical components that can degrade wavefront performance of an optical assembly.

A variety of methods have been used to isolate optical components from stresses transferred through their mountings. For example, flexures or semi-kinematic style mounting methods have been incorporated into lens holders (e.g., "cells"). These methods isolate the lenses from the stresses or strains produced by fastening adjacent lens holders or spacers together to form an integral lens assembly. Other methods use highly compliant adhesive layers between the lens elements and the holders to reduce deformations of the optical elements within the lens assemblies.

Methods have also been used to adjust optical elements based on performance measurements. For example, lenses or groups of lenses have been rotated or otherwise adjusted relative to one another to optimize measured performance. Yet another method uses a "correction element" that is deterministically manufactured to cancel measured wavefront errors of otherwise completed lens assemblies.

SUMMARY OF THE INVENTION

This invention in one or more of its preferred embodiments provides for reducing sources of error in optical assemblies by reducing or otherwise controlling stresses or strains that might otherwise arise between properly designed, toleranced, and manufactured optic holders or spacers, which are more generally referred to herein as stacking elements. The faces of various stacking elements intended for mating with other stacking element faces can be measured in advance of assembly, and low-order surface errors can be extracted from the measurements and expressed as mathematical approximations having principal (i.e., highest amplitude) frequencies. The error measurements can be used to arrange the stacking elements during assembly or to prearrange the stacking elements in advance of assembly. In situ measurements of exposed element faces during assembly can be used in combination with the error measurements of the individual faces of the stacking elements made prior to the assembly for such purposes as diminishing cumulative errors in a growing stack and avoiding stresses or strains on the optic holders within the stack.

The measured stacking elements can be grouped in combinations and relative angular orientations that juxtapose mating stacking faces having substantially complementary low-order surface errors with common or harmonic principal frequencies (e.g. radial or angular principal frequencies). Optical elements can be mounted in the optic holders prior to or during assembly of the stacking elements, and the combinations of stacking elements can be fastened together via compressive forces while minimizing accompanying stresses or strains that would otherwise distort the optic holders within other combinations. By reducing stresses or strains in the optic holders, less stress or strain is transferred between the optic holders and the optical elements supported by the holders (e.g., lenses) to achieve desired optical performance.

The surface error measurements of the stacking elements can be used in combination with in situ measurements made during a progressive assembly (i.e., "build") of the stacking elements. As each stacking element or group of stacking elements is secured together, an exposed stacking face of an intermediate stacking element (i.e., a stacking element already secured to a base mounting element or another stacking element) can be measured in situ to monitor cumulative low-order errors in the assembly, which can also be represented by mathematical approximations having principal frequencies. The next (adjoining) stacking element, whose adjacent surface errors can be premeasured, can be relatively oriented with respect to the intermediate stacking element to reduce the cumulative error, so that mating stacking faces of the intermediate and next stacking elements can be secured together via compressive forces while minimizing stress or strain that would otherwise distort one or more of the optic holders. The goal is not necessarily to minimize all stresses and strains in the stacking elements themselves but to reduce the stresses or strains that would otherwise distort the optic holders and thereby transfer to the optics of the optical assembly.

The faces of the adjacent stacking elements can be premeasured and paired with each other prior to or during assembly. In fact, mechanical tolerances for individual stacking elements can be relaxed so long as the measured low-order errors among mating faces are sufficiently complementary and the overall spacing and tilt tolerances are met.

Thus, prior to or during the assembly of compound optics, such as projection lenses, combinations of stacking elements (where choices are available) and their relative orientations can be identified for reducing or otherwise controlling stresses or strains accompanying the assembly of the compound optics. Prior to assembly, the faces of the stacking elements can be measured and low-order surface errors, including principal frequencies, identified. Adjacent stacking elements and/or their relative orientations can be chosen so that mating stacking faces have substantially complementary low-order surface errors with common or harmonic principal angular frequencies. Higher order errors can be considered for cumulative residual effects, but the principal frequencies best characterize the overall shapes of the faces and the possibilities for imparting unwanted stresses or strains.

The stacking elements generally include openings for the transmission of light through the optical elements supported by the stacking elements, and the principal angular frequencies can correspond to numbers of lobes projecting from the stacking faces along traces that circumnavigate the apertures.

The optimal relative orientations of the mating stacking faces having matching or integer multiple numbers of lobes can be determined as a relative displacement in phase around the apertures in angular increments equal to π divided by the number of lobes. Thus, stacking elements having mating faces with complementary surface forms can be nested together in particular relative orientations to generate less stress or strain on the optic holders within the assembly.

Lesser degrees of complementarity can also be exploited between mating stacking faces having different principal angular frequencies by relative angular orientations that minimize the difference between surfaces, i.e., the residual mismatch. While the available solutions may be less than ideal, stress and strain on the optic holders can still be reduced by combinations and relative orientations that provide for minimizing the residual mismatch between mating faces of the stacking elements.

Preferably, the stacking faces are premeasured interferometrically, and the interferometric measurements are filtered to obtain the mathematical approximations of the low-order surface errors. The mathematical approximations can include orthonormal polynomials having a radial order and an angular frequency referenced to datum feature (e.g., a fiducial mark or an identified feature) on the stacking elements. In addition to having common or harmonic angular frequencies, the complementary low-order surface errors of the mating stacking faces preferably have common or harmonic primary radial orders of opposite signs.

Cumulative residual low-order surface errors between mating stacking faces associated with any remaining departures in complementarity can be estimated in advance of assembly or measured during the course of assembly from the exposed faces of intermediate stacking elements. Pairings of mating stacking faces can be arranged relative to other pairings of mating stacking faces so that the departure in complementarity of one pairing is complementary to the departure in complementarity of one or more other pairings to avoid an accumulation of stress or strain between the pairings that would otherwise distort the optic holders within the combinations of stacking elements.

BRIEF DESCRIPTION OF THE DRAWING FIGURES

DETAILED DESCRIPTION OF THE INVENTION

Figure 1:
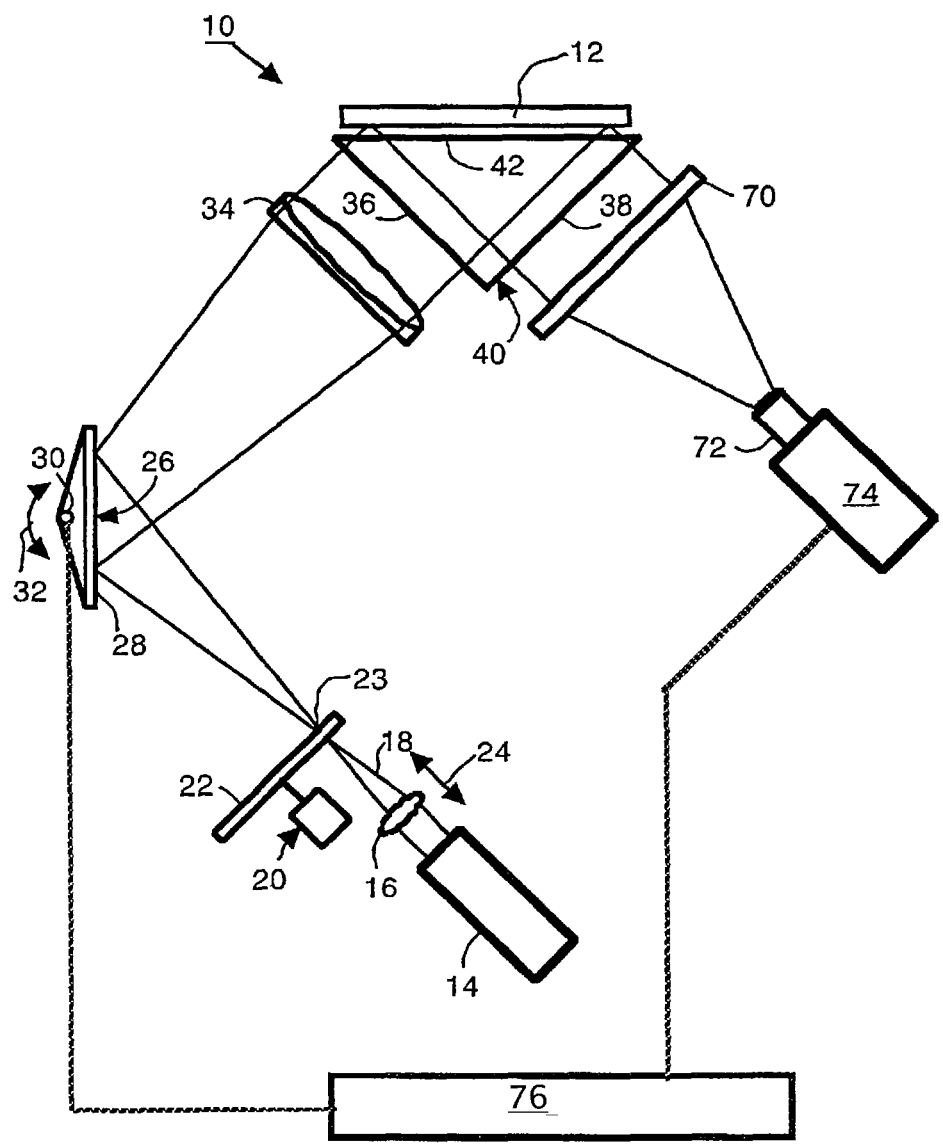
FIG. 1 is a diagram of a grazing incidence interferometer for measuring surface height variations of stacking element faces.

Grazing incidence interferometer 10, as shown in FIG. 1, is an example of an instrument that can be used for measuring surface errors, e.g., departures from flatness, of a stacking element 12. A light source 14, such as a laser diode, emits a beam 18 of temporally coherent light, which a focusing lens 16 sets on an initially converging path.

A coherence adjuster 20 having a rotating diffuser plate 22 interrupts a narrowed portion of the beam 18 to reduce spatial coherence of the beam 18. The rotating diffuser plate 22 interrupts the beam 18 and randomly scatters light illuminating a spot 23 on the diffuser plate 22. The light scattered from the spot 23 emulates an extended light source, whose size is inversely related to the degree of spatial coherence of the beam 18. The focusing lens 16 is movable in the directions of arrows 24 to change the size of the illuminated spot 23 for adjusting the spatial coherence of the beam 18.

An expanding portion of the beam 18 propagates through a tilt mechanism 26 having a reflective surface 28 and a pivot 30 for tilting the reflective surface 28 through a limited range of angles in the directions of arrows 32. Similar amounts of beam tilt can be achieved by interrupting the beam 18 with a pivotal plane parallel plate. When inclined from normal to the propagating beam 18, light transmits through the plate from an apparent source that is offset from the extended light source on the diffuser plate 22.

A collimating lens 34, whose focal length is measured from the diffuser plate 22, converts the expanding beam 18 into a nominally collimated beam 18 that approaches one side 36 of a triangular prism 40 at close to normal incidence. The side 36 is preferably one of two equal length sides 36 and 38 that are inclined to a base 42 at approximately 45-degree angles. Although expanded, residual divergence of the nominally collimated beam 18 is slightly increased by the limited spatial coherence of the beam 18, and the average incident angle of the collimated beam 18 approaching the prism 20 can depart slightly from normal by the tilt of the beam 18.

Figure 2:
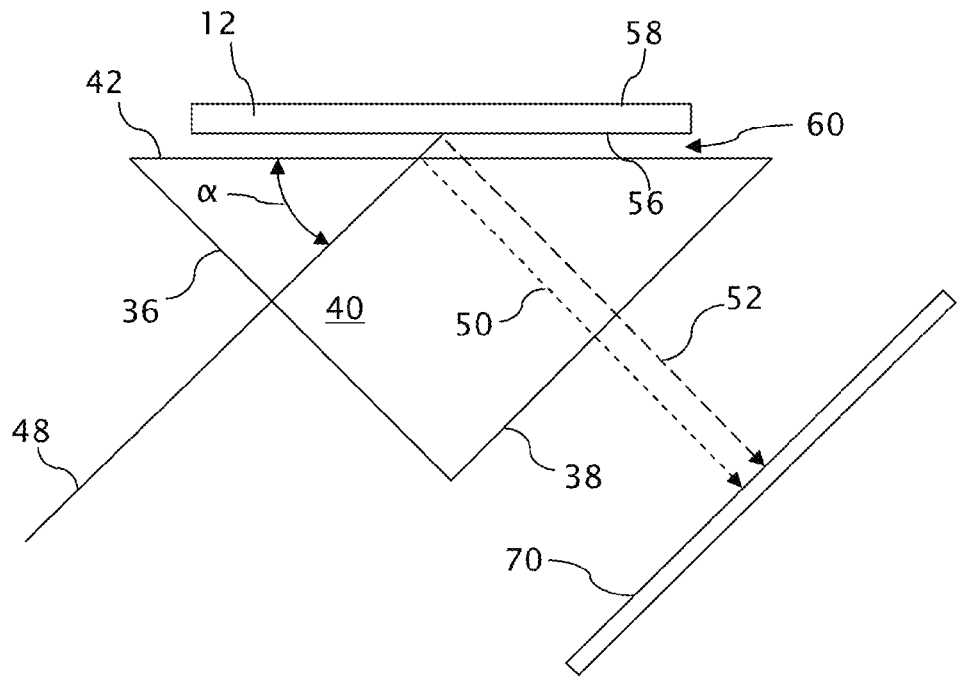
FIG. 2 is an enlarged diagram showing the splitting of a central ray into a reference ray reflected from a prism reference surface and an object ray reflected from a stacking element face.

With reference to FIG. 2, a central ray 48 of the beam 18 propagates through the prism 40 and is partially reflected from the base face 42 of the prism 40 through a non-normal grazing angle "α" as a reference beam ray 50. The grazing angle "α" is defined as a non-normal angle inclined from a reflective surface (the base face 42 of the prism 40) within a range of specular reflection. Angles of so-called "grazing incidence" are complementary to these "grazing angles". Measures taken at grazing incidence increase reflectivity, allowing a wider range of surfaces, including non-specular reflective surfaces, to be interferometrically measured.

Another portion of the ray 48 is refracted from the base face 42 through an air gap 60 before being reflected from a first face 56 of two opposite side (i.e., top and bottom) faces 56 and 58 of the stacking element 12 as an object beam ray 52. The reference beam ray 50 and the object beam ray 52 exit the prism 40 through the prism face 38 relatively sheared but nominally parallel to each other. Preferably, the non-normal grazing angle "α" is at least approximately equal to the complement of a base angle of the prism 40 so that all of the rays 48, 50, and 52 enter or leave the prism 40 at close to normal incidence.

Figure 3:
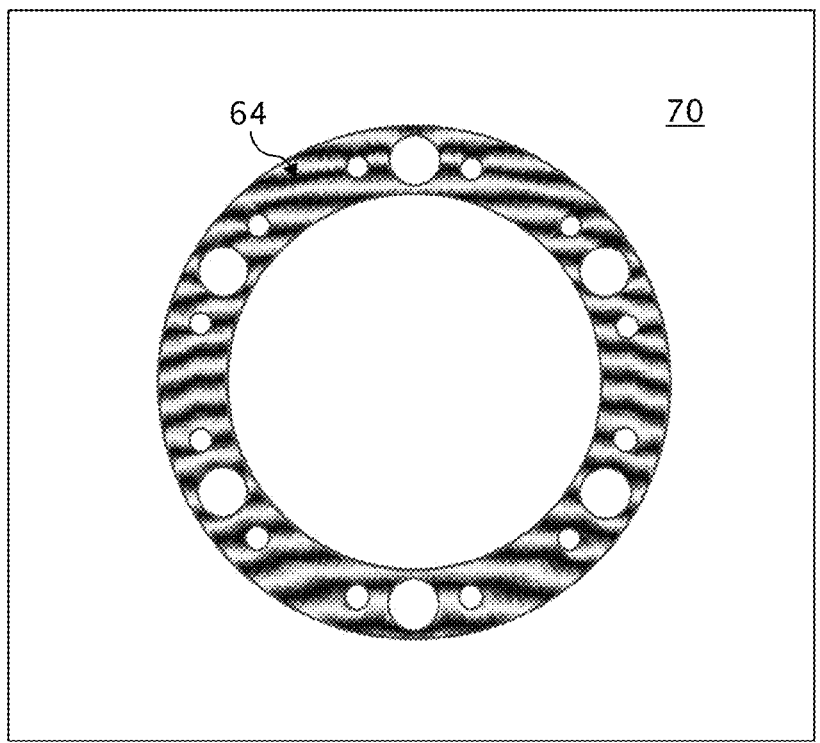
FIG. 3 is a plan view of an interference pattern formed on a diffuse screen of the interferometer.

The reference beam ray 50 is one of a number of rays from the beam 18 that are reflected through the same grazing angle α at different points along the base face 42 of the prism 40 to form a reference beam. The object beam ray 52 is one of the number of rays from the beam 18 that are reflected at different points along the stacking element face 56 to form an object beam. The reference and object beams collectively form an interference pattern 64 (see for example FIG. 3) on a diffused viewing screen 70, which can be made of ground glass or plastic. The interference pattern 64 contains information concerning the flatness of the stacking element face 56.

The diffused viewing screen 70, which can be rotated or dithered to further randomize the diffusion, fixes an image of the interference pattern 64 so than an ordinary zoom lens 72 (see FIG. 1) can project the image onto a recording device 74, such as a charge-coupled device (CCD) camera. Other image-forming optics and recording devices can be used to capture similar information from the interference pattern 64 appearing on the screen 70 or at other locations, such as at the base face 42 of the prism 40. A processor 76 receives the information captured by the recording device 74 for converting measures of intensity variations to measures of variations in surface height.

Phase shifting or other known techniques can be used to convert the intensity data recorded from the interference pattern 64 into measures of height variation across the face 56. The relative optical path lengths traversed by the reference and object beams can be varied to cycle individual points in the interference pattern 64 through respective cycles of constructive and destructive interference, so that the intensity of individual pixels captured by the recording device 74 can be scaled to a phase value within a cycle of interference. For example, the tilt mechanism 26 can be controlled by the processor 76 to slightly vary the grazing angle α to vary the path length differences between the reference and object beams.

Phase unwrapping techniques can be used to resolve ambiguities between similarly appearing phases in different interference cycles so that cumulative variations in phase across the face 56 covering multiple cycles of interference can be measured. Based on the known relationship between variations in phase as fractions of the wavelength of the measuring beam 18, variations in surface height across the face 56 can be calculated.

The opposite side face 58 of the stacking element 12 can be similarly measured as well as the opposite side faces of other stacking elements. Other types of interferometers can also be arranged for measuring the faces of stacking elements having mechanical, non-specular reflective surfaces including Fizeau grazing incidence interferometers, Shack-Hartmann wavefront analyzers, and white light interferometers. Compound interferometers can be used to measure the opposite side faces simultaneously and to acquire information concerning thickness variations of the stacking elements 12.

The height variations across the faces 56 and 58 of the stacking elements 12 can be treated as deviations from a desired flatness (or other intended shape) and can be filtered to remove higher order variations, leaving measures of low-order surface errors. For example, Fourier or Zernike filtering/decomposition can be used to transform the height variations into one or more polynomials that describe the overall variations in the shapes of the surfaces. Zernike polynomials can be formulated as combinations of radial and azimuthal terms through a range of orders for approximating the measured surfaces. The radial orders are symmetric about a central axis of the stacking elements 12. The azimuthal orders correspond to angular frequencies around the central axis.

The conventional Zernike polynomial set is orthogonal for a filled circular area, but not necessarily for annuli, such as the faces 56 and 58 of the illustrated stacking element 12. However, the amount of non-orthogonality is not expected to be an issue because the annuli are generally the same size from stacking element to stacking element so amplitudes are distorted equally and phase relationships are maintained. Those of skill in this art will readily recognize that, if required, modified orthogonal Zernike-like set polynomial sets can be generated according to the shapes of the stacking element faces.

The filtering/decomposition transforms fit a range of predefined polynomial terms to the data by weighting their respective correlations such that the sum of the relatively weighted polynomial terms closely approximates the surface height variations. Among the terms, the azimuthal order weighted as most closely correlating with the height measurements can be regarded as a primary angular frequency of the measured surface.

Figure 4:
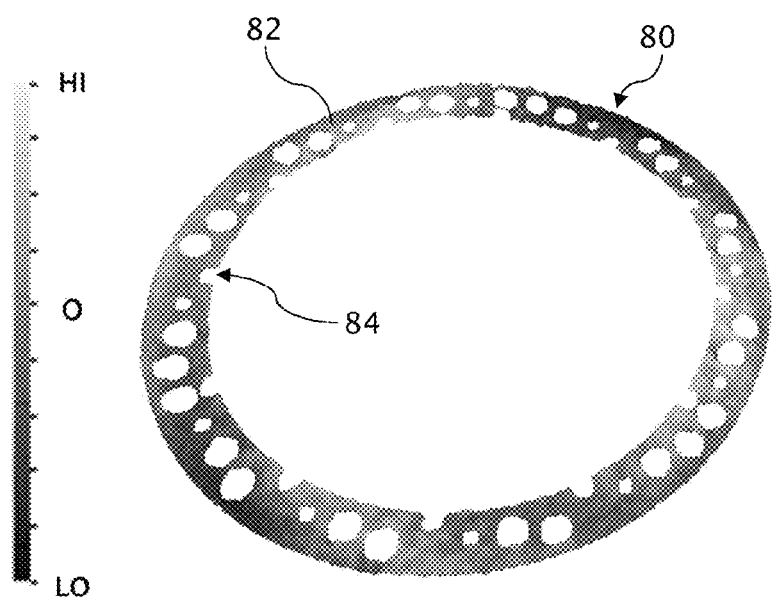
FIG. 4 is a gray-scale image of an interference pattern appearing together with an image of the stacking element face.
Figure 5A:
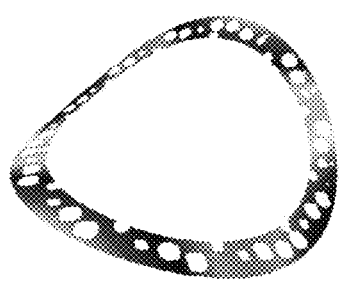
FIGS. 5A-5C are exaggerated images of low-order surface errors that can be used to characterize the stacking element faces.
Figure 5B:
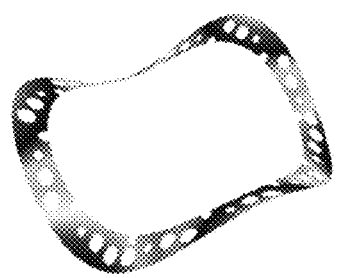
Figure 5C:
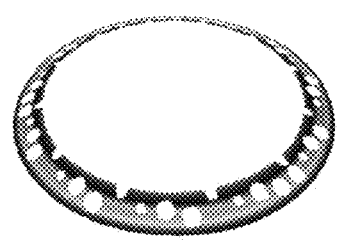

FIG. 4 depicts a stacking element 80 that is color coded in gray scale to illustrate measures of height measurements of a face 82. FIGS. 5A-5C depict three examples of decomposed polynomial shapes of Fourier or Zernike transforms of a measured surface, such as the face 82, greatly exaggerated to emphasize the decomposed surface forms as departures from flatness. In particular, FIG. 5A depicts an annular two-lobe error surface, as mathematically defined by a second order azimuthal term having an angular frequency of two. FIG. 5B depicts an annular three-lobe error surface, as mathematically defined by a third order azimuthal term having an angular frequency of three. Thus, the primary angular frequencies correspond to numbers of lobes projecting from the stacking faces along traces that circumnavigate the apertures. FIG. 5C depicts an annular surface having radial taper as defined by an even order radial term having a sign representing the direction of the taper. For exploiting the limited grouping and relative orientation possibilities associated with assembling stacking elements, the faces, e.g., 82, of the stacking elements, e.g., 80, are characterized upon measurement by their principal azimuthal and radial order terms, i.e., the azimuthal and radial orders having the highest weighting among the decomposed azimuthal and radial order terms. The principal azimuthal order term, referred to as a principal angular frequency, can be visualized by the number of lobes in the exaggerated error surface. The principal angular frequencies, like their underlying azimuthal order terms, include a phase relative to the measured orientation of the stacking element, which can be referenced to a fiducial mark 84 on the stacking element 80. Thus, the measurements determine not only the number of lobes about an axis of the stacking elements but also the positions of the lobes around the axis with respect to a fiducial mark.

Figure 6A:
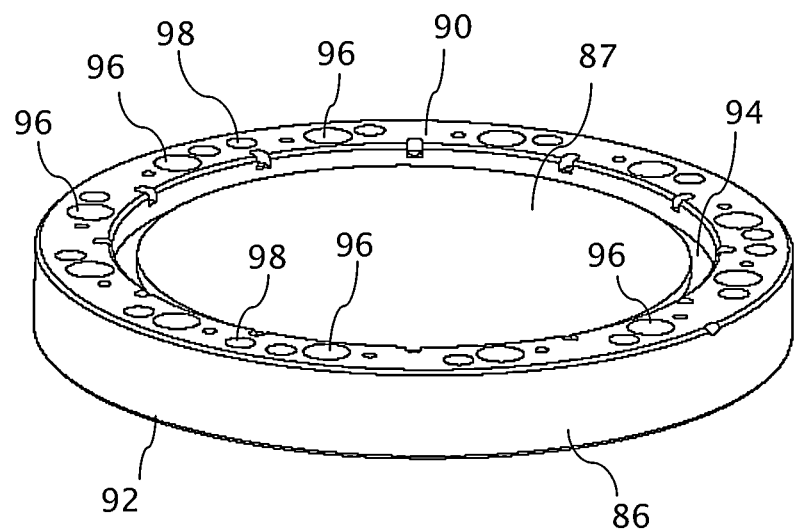
FIGS. 6A and 6B are perspective views of an individual stacking element in the form of an optic holder with a cut-away view in FIG. 6B showing a cross section.
Figure 6B:
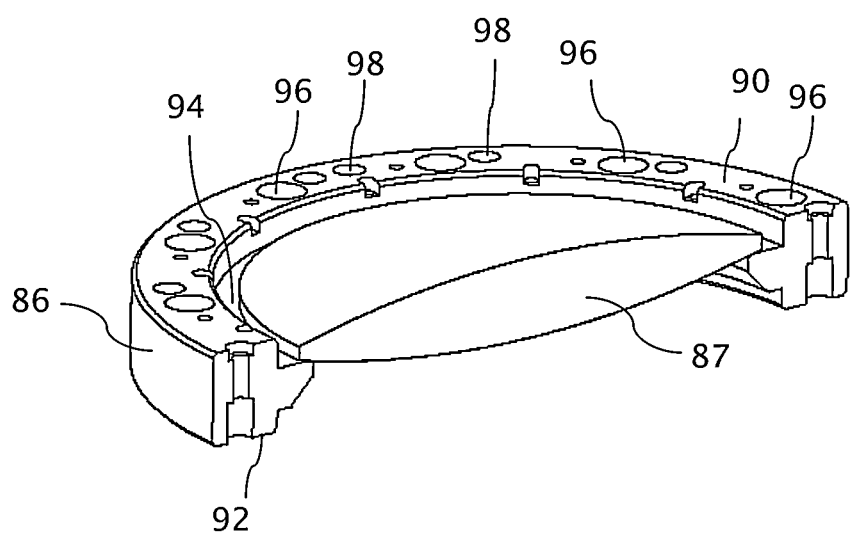

FIGS. 6A and 6B depict a stacking element 86 in the form of a lens holder for holding a lens 87, including opposite side faces 90 and 92 for assembling the stacking element 86 together with other stacking elements of an optical assembly. The stacking element 86 includes a seating ring 94 surrounding a central aperture for supporting a periphery of the lens 87. An adhesive can be used for securing the lens 87 to the seating ring 94. A number of through holes 96 provide for bolting the stacking element 86 together with other stacking elements and other holes 98 provide for temporarily aligning the stacking elements with pins or the like. Any one of the holes 96 or 98 or other features of the stacking element 86 can be used as a fiducial mark for referencing the measured low-order surface errors of the faces 90 and 92.

Figure 7A:
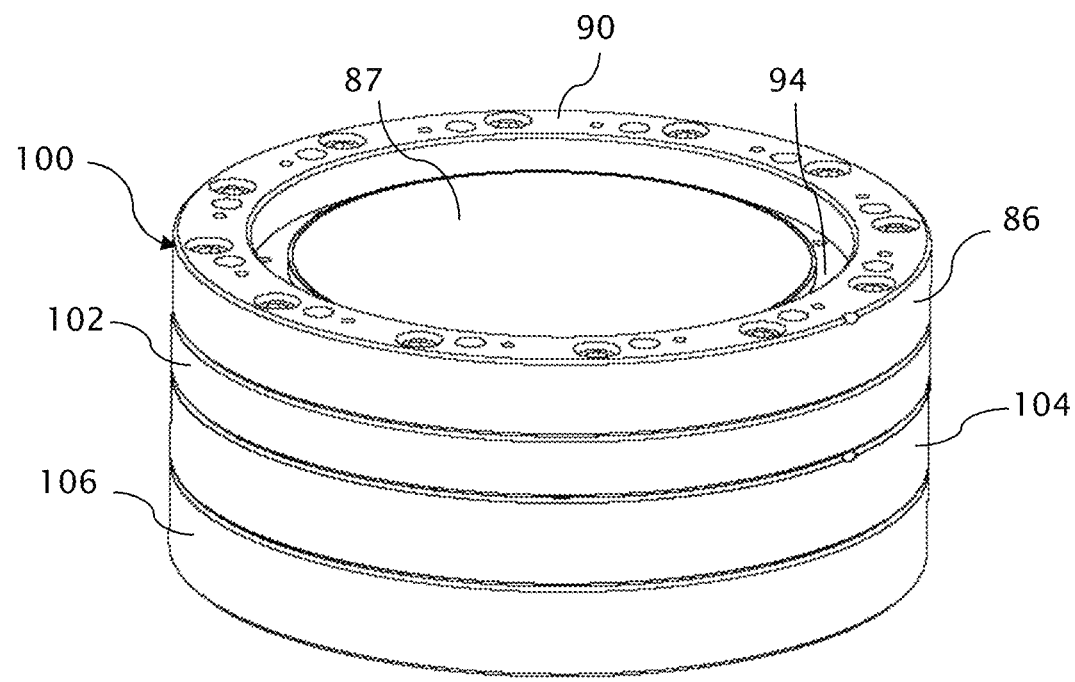
FIGS. 7A and 7B are perspective views of at least a partial assembly of four stacking elements with a cut-away view in FIG. 7B showing a cross section of the assembly.
Figure 7B:
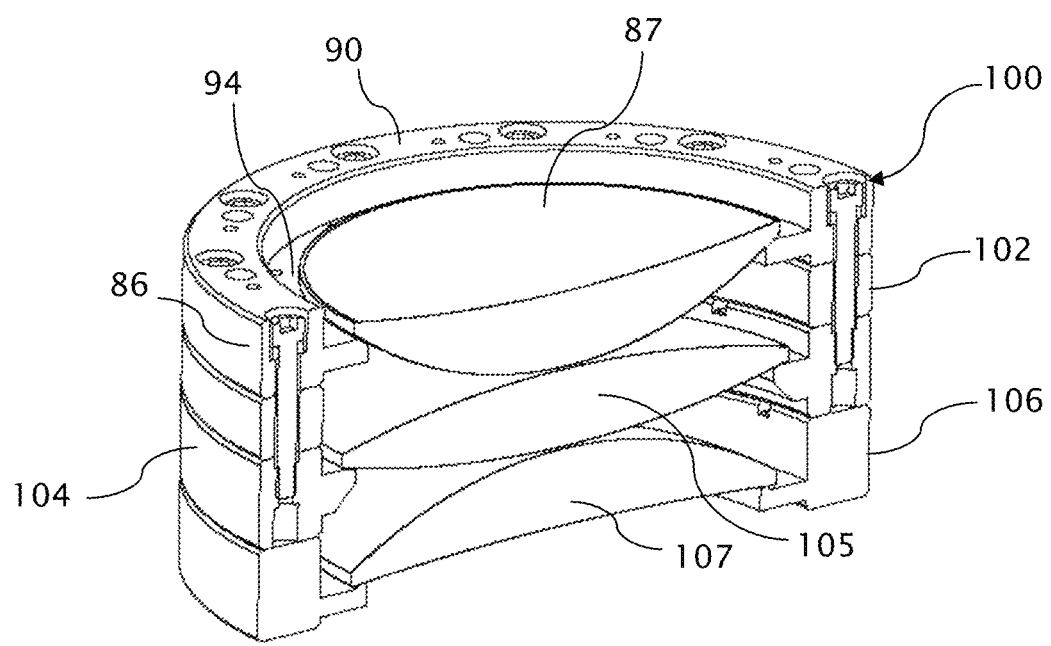

An optical assembly 100, comprising the stacking element 86 together with stacking elements 102, 104, and 106 is shown in FIGS. 7A and 7B. The optical assembly 100 can represent an entire optical assembly or a subassembly of a larger optical assembly intended to include additional stacking elements. The stacking element 102 is a spacer, and stacking elements 86, 104, and 106 are lens holders for holding respective lenses 87, 105, and 107. The stacking elements 86, 102, 104, and 106 provide for spacing and aligning the lenses 87, 105, and 107 along a common optical axis.

Information gained by measuring the opposite side faces 90 and 92 of the stacking element 86, together with the opposite side faces of the stacking elements 102, 104, and 106, can be used during assembly (or "build") to reduce stresses or strains in the optical assembly 100. The measurements can be made of one or both faces, e.g., 90 and 92, of the stacking elements 86, 102, 104, and 106 intended to complete the optical assembly 100 as well as of one or both faces of additional stacking elements that could be substituted into the assembly 100. The measurements of both faces, e.g., 90 and 92, of the stacking elements 86, 102, 104, and 106 alone can be used to optimize the build of the assembly 100 by determining in advance of assembly a desired arrangement of the stacking elements 86, 102, 104, and 106. Alternatively, in situ measurements made during assembly can be combined with measurements made of the individual stacking elements 86, 102, 104, and 106 to determine the desired arrangement of the stacking elements 86, 102, 104, and 106 during assembly.

For example, the opposite side faces, e.g., 90 and 92, of the stacking elements 86, 102, 104, and 106 intended for the predefined optical assembly 100 can be individually measured and low-order surface errors extracted for determining the principal angular frequency and signed radial order of each of the faces, e.g., 90 and 92. Additional stacking elements as possible substitutes for one or more of the stacking elements 86, 102, 104, and 106 required for the predefined optical assembly 100 can be similarly measured.

The stacking elements 86, 102, 104, and 106 are ordered as prescribed for the optical assembly 100 and the low-order errors of the mating faces of adjacent stacking elements are compared. The stacking elements 86, 102, 104, and 106 are relatively rotated with respect to each other to minimize the accumulation of low-order errors, particularly with respect to the stacking elements 86, 104, and 106 that function as optic holders. For example, where the principal angular frequencies of mating stacking faces match or are harmonically related, the adjacent stacking elements are preferably relatively oriented to juxtapose low-order surface errors in a substantially complementary fashion. That is, the root mean square of the low-order surface errors between the mating stacking faces is less than a root mean square of the low-order surface errors of either of the mating stacking faces alone.

Figure 8A:
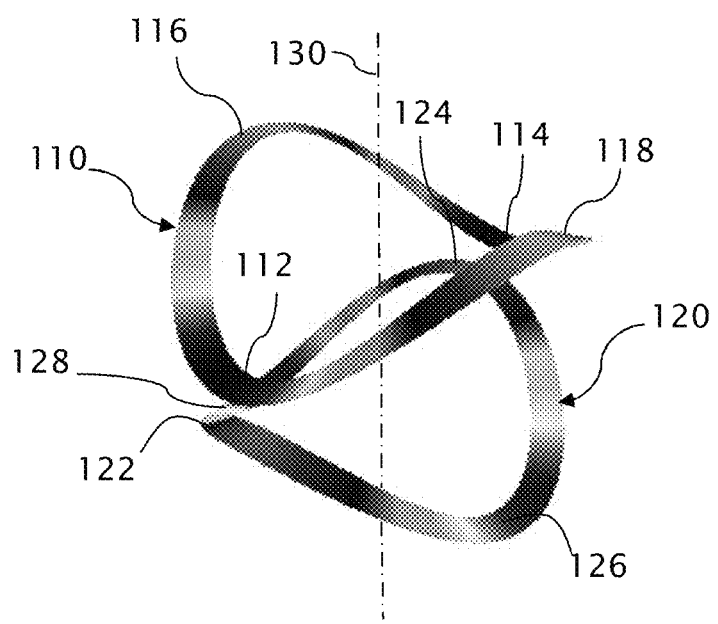
FIGS. 8A and 8B are perspective views of the low-order surface errors of mating stacking element faces in two different relative rotational positions with FIG. 8B showing a preferred relative position for promoting complementarity between the error surfaces.
Figure 8B:
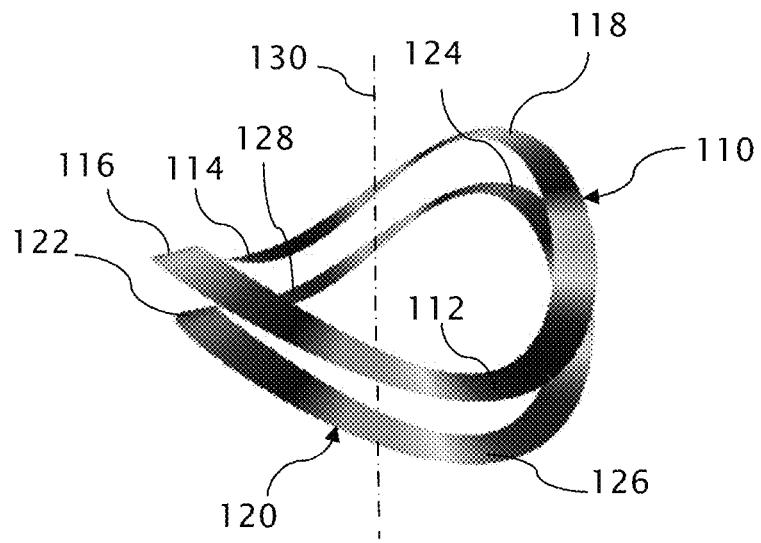

FIGS. 8A and 8B show two possible relative orientations of low-order surface errors having a principal angular frequency of two around a common axis 130. The upper surface 110 in both illustrations represents the low-order surface errors of a mating bottom face of an upper stacking element, and the lower surface 120 in both illustrations represents the low-order surfaces errors of a mating top face of a lower stacking element. Lobes 112 and 114 of the upper surface 110 project downwardly and troughs 116 and 118 of the upper surface 110 project upwardly, both referenced with respect to the bottom face of the upper stacking element. Conversely, lobes 122 and 124 of the lower surface 120 project upwardly and troughs 126 and 128 of the lower surface 120 project downwardly, both referenced with respect to the top face of the lower stacking element. In FIG. 8A, the lobes 112 and 114 of the upper surface 110 are rotationally aligned with the lobes 122 and 124 of the lower surface 120, and this arrangement that would produce contact stresses between the lobe pairings 112, 122, and 114, 124 that would tend to relatively distort the upper and lower stacking elements. In contrast, the lobes 112 and 114 of the upper surface 110 in FIG. 8B are aligned with the troughs 126 and 128 of the lower surface 120, and the troughs 116 and 118 of the upper surface 110 in FIG. 8B are aligned with the lobes 122 and 124 of the lower surface 120. Thus, with respect to FIG. 8A, the lobes 112 and 114 of the upper surface 110 are relatively rotated around the axis 130 in relation to the lobes 122 and 124 of the lower surface by the quantity $\pi$ divided by the number of lobes in each surface 110 and 120, which in this instance equates to 90 degrees. The desired relative orientation of the upper and lower stacking elements in FIG. 8B, allows the upper and lower stacking elements to be secured together while imparting a minimum of stress.

Similar relative orientations between mating stacking faces can be achieved for mating stacking surfaces having similar or harmonic principal frequencies by relatively rotationally offsetting the measured lobes of the mating surfaces to avoid localized contact stresses. Even if the mating stacking surfaces do not have similar or harmonic principal frequencies, relative rotations between the adjacent stacking elements can be found to diminish contact stresses. Where possible, other measured stacking elements can be substituted into the assembly to provide mating surfaces that can be oriented in a more complementary fashion. Where each stacking element has a limited number of different relative rotational positions, e.g., because of securing through pre-drilled bolt holes, the best choice is made between the different relative rotational positions for minimizing contact stresses.

While high contact stresses are generally avoided, preference is given to avoiding contact stresses that could distort the stacking elements functioning as optic holders. In this regard, cumulative errors in the assembly can also be considered. For example, any departures from complementarity between mating stacking surfaces can be calculated as difference surfaces that can be added together to track cumulative errors throughout the intended assembly. Instead of optimizing complementarity between the error surfaces of all of the mating stacking surfaces, some deliberate departures from complementarity can be imparted to counteract cumulative errors that could otherwise distort optic holders within the assembly.

The difference surfaces themselves can be similarly characterized in terms of low-order errors. For example, normalized height measurements of corresponding points can be compared between mating surfaces and the difference measurements filtered/decomposed into low-order errors or the low-order errors of the respective mating surfaces can be directly compared to define the difference surfaces. At least the cumulative difference surfaces are preferably characterized by their principal angular frequencies for comparison with the principal angular frequencies of the mating surfaces intended to reduce the cumulative mismatch of other mating surfaces.

In addition to accounting for the principal angular frequencies of the low-order errors characterizing the stacking faces, the signed radial order of the low-order errors can also be considered. While different radial order errors can generate some lines of stress, common radial orders of the same sign can produce even higher lines of stress or accentuate points of stress combined with azimuthal order errors. For example, two radial tapers of the same sign would tend to generate difference surfaces at twice the magnitude of the taper. However, two radial tapers of opposite signs would tend to cancel any difference. Thus, where possible, the stacking elements are chosen or arranged so that the radial orders of the low-order error surfaces have opposite signs. Cumulative effects of the radial order errors can also be taken into account when choosing or arranging the stacking elements to avoid over-stressing the optic holders.

Thus, the low-order surface errors of the premeasured stacking faces can be used to prearrange stacking elements that can be secured together to form an optical assembly. The desired rotational orientations of the selected stacking elements can be marked, optics mounted within the optic holders, and the stacking elements built into an optical assembly in accordance with the marked rotational orientations of the stacking elements.

Alternatively, at least one face of the respective stacking elements can be measured, such as the bottom face of each stacking element intended to be mounted atop one another, and in situ measurements can be made of the top face of each stacking element as an exposed face of a growing assembly. During assembly, the exposed top face of a base stacking element can be measured in situ using a measuring instrument such a coordinate measuring machine with an optical or mechanical probe or even an interferometer for single surface measurement. Preferably, at least the principal angular frequency of the low-order surface errors evident in the exposed stacking face is determined with respect to a rotational fiduciary of the base stacking element. Based on the pre-measurement of the bottom face of a first adjoining stacking element for which a principal angular frequency is also determined and fiducially referenced, the first adjoining stacking element can be relatively oriented with respect to the base stacking element so that the low-order surface errors of the mating faces are substantially complementary as may be admitted by the nature of the errors and the options for relative orientation. With the base and first adjoining stacking elements secured in place, the exposed top face of the first adjoining stacking element can be similarly measured in situ, and the premeasured bottom face of a second adjoining stacking element can be relatively arranged according to the same criteria. Where additional stacking elements are available as substitutes, the adjoining stacking elements can be selected from among the available substitutes to best complement the low-order surface errors of the exposed stacking faces. Generally, the optics are mounted in the stacking elements before securing the stacking elements together.

To further reduce cumulative errors affecting the lens holders, difference surfaces can be calculated between the in situ measured low-order surface errors of the exposed top faces of stacking elements in the growing assembly and the premeasured low-order surface errors of the bottom faces of the adjoining stacking elements as relatively rotated to promote complementarity (manifest as a reduction in the overall magnitude of the difference surface). The difference surfaces, although minimized by the rotational orientations of the adjoining stacking elements, can be added together as a measure of cumulative error. In addition to taking into account issues of complementarity between the top and bottom faces of the stacking elements growing the assembly, provisions can be made for accepting a lesser complementarity between mating faces to reduce the measured cumulative error that could otherwise transmit stress or strain throughout the optical assembly. For example, the departure in complementarity of one pairing of mating stacking faces can be made at least partially complementary to the departure in complementarity of another pairing of mating stacking faces to avoid an accumulation of stress or strain between the pairings.

Figure 9:
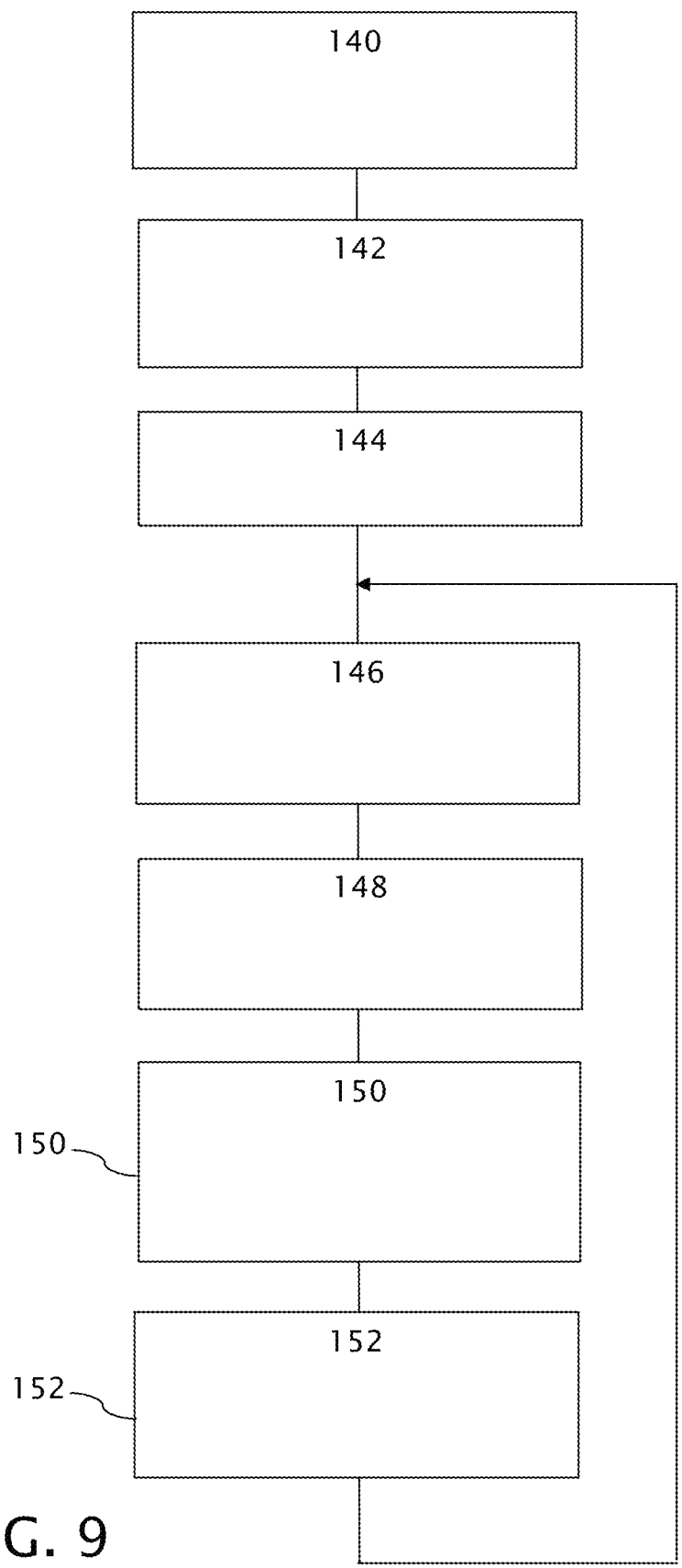
FIG. 9 is a flow chart presenting steps for building an optical assembly using both premeasures of the stacking element faces and in situ measures of the exposed faces of a growing stack.

In FIG. 9, a flow chart shows basic steps for building and optical assembly utilizing both pre-measurements of the stacking elements and in situ measurements of the growing assembly. Step 140 premeasures the faces of a plurality of stacking elements. The measurements are filtered and decomposed into low-order surface errors characterizing the overall shapes of the stacking faces. Step 142 selects among the available stacking elements to fulfill requirements of an optical assembly. In step 142, the selection is deemed random among corresponding stacking elements, but optimum combinations of stacking elements could be chosen from among the available stacking elements based on premeasures of the low-order surface errors of the opposite side faces of the stacking elements. Step 144 mounts optics within the optic holders of the stacking elements. Step 146 begins a cycle where in situ measurements are made of an exposed face of a stacking element within a subassembly (i.e., a growing assembly) of the stacking elements. The in situ measurements are similarly filtered and decomposed into low-order surface errors characterizing the overall shapes of the exposed stacking faces. Step 148 retrieves the pre-measurement results of the mating face of the next adjoining stacking element. Step 150 determines from available choices a relative orientation of the adjoining stacking element at which the low-order surface errors of the mating faces approach complementarity. However, allowances can also be made for residual departures in complementarity between other assembled pairings of mating stacking surfaces to avoid cumulative errors in the growing assembly. Step 152 mounts the next adjoining stacking element as determined and reverts to the procedure to step 146 for orienting and mounting additional adjoining stacking elements to complete the desired optical assembly.

The invention can be practiced in a variety of other ways in accordance with the overall teaching of the invention for utilizing measurements of low-order surface errors in stacking elements to reduce stress or strain in optical assemblies.

The invention claimed is:

1. A method of assembling a compound optic including a plurality of stacking elements for spacing, aligning, and retaining optical elements comprising steps of
    measuring stacking faces of a plurality of stacking elements that include optic holders,
    extracting from the measurements surface errors that can be represented by mathematical approximations having a primary angular frequency from the measurements of the stacking faces,
    relatively positioning the stacking elements including the optic holders in relative orientations that enhance complementarity between the surface errors of mating stacking faces, and
    securing combinations of relatively oriented stacking elements together to control stress or strain that would otherwise distort the optic holders in other relative orientations.

2. The method of claim 1 in which stacking elements include apertures, and the primary angular frequencies correspond to numbers of lobes projecting from the stacking faces along traces that circumnavigate the apertures.

3. The method of claim 2 in which the mating stacking faces have matching numbers of lobes that are relatively displaced in phase around the apertures by approximately $\pi$ divided by the number of lobes.

4. The method of claim 1 in which the surface errors that can be represented by mathematical approximations have a primary radial order, and the complementary surface errors of the mating stacking faces have a common primary radial order of opposite signs.

5. The method of claim 1 including a step of determining residual surface errors between mating stacking faces associated with any remaining departures in complementarity.

6. The method of claim 5 including arranging pairings of mating stacking faces relative to other pairings of mating stacking faces so that the departure in complementarity of one pairing is complementary to the departure in complementarity of another pairing to avoid an accumulation of stress or strain between the pairings that would otherwise distort the optic holders within the combinations of stacking elements.

7. The method of claim 1 in which the step of securing combinations of relatively oriented stacking elements together includes securing the stacking elements together in a progression so that within the progression an intermediate stacking element secured to other stacking elements includes an exposed stacking face intended for engagement with the mating stacking face of a succeeding stacking element yet to be secured and including a step of measuring the exposed stacking face of the intermediate stacking element to measure cumulative errors that can be represented by mathematical approximations having a primary angular frequency.

8. The method of claim 7 including relatively orienting the succeeding stacking element with respect to the intermediate stacking element secured to the other stacking elements so that mating stacking faces of the succeeding and intermediate stacking elements have substantially complementary surface errors with common primary angular frequencies.

9. The method of claim 1 in which the step of measuring includes measuring the stacking faces, and the step of extracting includes filtering the measurements to obtain measurements of surface errors that can be represented by mathematical approximations having a primary angular frequency.

10. The method of claim 9 in which the mathematical approximations include orthonormal polynomials having a radial order and an angular frequency referenced to datum feature on the stacking elements.

11. The method of claim 10 in which the substantially complementary surface errors of the mating stacking faces have a common primary radial order of opposite signs and a common angular frequency, and mating stacking faces are relatively displaced in phase around apertures of the stacking elements by approximately .pi. divided by the angular frequency.

12. The method of claim 1 in which the surface errors represented by mathematical approximations include power, astigmatism, coma, trefoil and spherical aberration.

13. The method of claim 12 in which a root mean square of the surface errors between the mating stacking faces is less than a root mean square of the surface errors of either of the mating stacking faces.

14. A method of assembling a compound optic including a plurality of stacking elements for spacing, aligning, and retaining optical elements comprising steps of providing a plurality of stacking elements each having first and second side faces, assembling a first of the stacking elements to a second of the stacking elements leaving the first side face of the second stacking element exposed, measuring the exposed first side face of the second stacking element to measure cumulative surface shape errors in the exposed first side face of the second stacking element, measuring the second side face of a third of the stacking elements to measure surface shape errors in the second side face of the third stacking element, relatively orienting the third stacking element with respect to the second stacking element so that the respective first and second side faces of the second and third stacking elements have substantially complementary surface shape errors, securing the relatively oriented third stacking element to the second stacking element leaving the first side face of the third stacking element exposed, and repeating the steps of measuring, orienting, and securing for each of a desired additional number of the stacking elements for progressively assembling a stack, wherein the ordinal designations of the second and third stacking elements are indexed by one as each additional stacking element is secured to the stack.

15. The method of claim 14 in which the third stacking element can be secured to the second stacking element in a given number of different angular positions, the third stacking element being an optic holder, and the step of relatively orienting the third stacking element includes choosing the different angular position at which the surface shape errors of the respective first and second side faces of the second and third stacking elements are most complementary.

16. The method of claim 14 in which the step of measuring the second side face of the third stacking element includes measuring the first and second side faces of the third stacking element to measure cumulative surface shape errors in the first and second side faces of the third stacking element prior to securing the third stacking element to the second stacking element.

17. The method of claim 16 including steps of measuring the exposed first side face of the third stacking element secured to the second stacking element to measure cumulative surface shape errors in the exposed first side face of the third stacking element, and comparing the cumulative surface shape errors in the exposed first side face of the third stacking element to the cumulative surface shape errors of the first side face of the third stacking element prior to securing the a third stacking element to measure the amount of distortion in the secured third stacking element.

18. A method of assembling a compound optic including a plurality of stacking elements for spacing, aligning, and retaining optical elements comprising steps of measuring opposite side stacking faces of a plurality of stacking elements that include optic holders, extracting from the measurements surface errors that can be represented by mathematical approximations having a primary angular frequency from the measurements of each of the stacking faces, relatively orienting and grouping the stacking elements including the optic holders in combinations that juxtapose mating stacking faces having substantially complementary surface errors, and securing the combinations of relatively oriented stacking elements together into an optical assembly according to their grouping to minimize stress or strain that would otherwise distort the optic holders in other combinations.

19. The method of claim 18 in which the step of measuring includes measuring more stacking elements than required to assemble the optical assembly and the step of grouping includes selecting among the stacking elements for inclusion within the optical assembly to provide a combination at which the mating faces of the stacking elements are more complementary.

20. The method of claim 18 in which the surface errors can be represented by mathematical approximations having a primary radial order, and the step of grouping includes juxtaposing mating stacking faces having common primary radial orders of opposite signs.

* * * * *